United States Patent
Inoue

(10) Patent No.: US 9,514,914 B2
(45) Date of Patent: Dec. 6, 2016

(54) SHOT DATA GENERATION METHOD AND MULTI CHARGED PARTICLE BEAM WRITING METHOD

(71) Applicant: NuFlare Technology, Inc., Yokohama (JP)

(72) Inventor: Hideo Inoue, Kanagawa (JP)

(73) Assignee: NuFlare Technology, Inc., Yokohama (JP)

( * ) Notice: Subject to any disclaimer, the term of this patent is extended or adjusted under 35 U.S.C. 154(b) by 0 days.

(21) Appl. No.: 14/661,496

(22) Filed: Mar. 18, 2015

(65) Prior Publication Data

US 2015/0294836 A1 Oct. 15, 2015

(30) Foreign Application Priority Data

Apr. 9, 2014 (JP) .................................. 2014-080480

(51) Int. Cl.
*H01J 37/302* (2006.01)
*H01J 37/317* (2006.01)
*G11B 9/10* (2006.01)

(52) U.S. Cl.
CPC ........ *H01J 37/3026* (2013.01); *H01J 37/3177* (2013.01); *G11B 9/10* (2013.01); *H01J 2237/30422* (2013.01); *H01J 2237/3175* (2013.01); *H01J 2237/31715* (2013.01); *H01J 2237/31722* (2013.01); *H01J 2237/31754* (2013.01); *H01J 2237/31762* (2013.01)

(58) Field of Classification Search
None
See application file for complete search history.

(56) References Cited

U.S. PATENT DOCUMENTS

2014/0054469 A1* 2/2014 Nishimura .......... H01J 37/3174
250/400

FOREIGN PATENT DOCUMENTS

| JP | 2006-261342 A | 9/2006 |
| KR | 10-2009-0085534 A | 8/2009 |
| KR | 10-2013-0135772 A | 12/2013 |

OTHER PUBLICATIONS

Office Action issued Dec. 14, 2015 in Korean Patent Application No. 10-2015-0049487 (with English language translation).
Office Action issued Aug. 22, 2016, in Taiwanese Patent Application No. 104107917 (with English-language translation).

* cited by examiner

*Primary Examiner* — Brian Butcher
(74) *Attorney, Agent, or Firm* — Oblon, McClelland, Maier & Neustadt, L.L.P.

(57) ABSTRACT

A shot data generation method includes inputting writing data for writing a pattern on a target object with multi charged particle beams, and generating shot data for each beam of the multi charged particle beams by converting the writing data and using one of a first code indicating a first irradiation time period having been set beforehand, a second code indicating an irradiation time period being zero, and a third code indicating neither the first irradiation time period nor the irradiation time period being zero.

11 Claims, 8 Drawing Sheets

| code | Contents |
|------|----------|
| 11 | shottime_data Having Been Set Beforehand in Irradiation Unit |
| 01 | Shottime=0 |
| 00 | Normal 10-bit Data |

First Pass To (M-2)th Pass

FIG. 8

```
1 block:[shotdata1][shotdata2][shotdata3]·······[shotdataN]
2 block:[shotdata1][shotdata2][shotdata3]·······[shotdataN]
3 block:[shotdata1][shotdata2][shotdata3]·······[shotdataN]
                          :
M block:[shotdata1][shotdata2][shotdata3]·······[shotdataN]
```

FIG. 9

| code | Contents |
|---|---|
| 11 | shottime_data Having Been Set Beforehand in Irradiation Unit |
| 01 | Shottime=0 |
| 00 | Normal 10-bit Data |

FIG. 10

```
1 block:11011100[shotdata4]1100[shotdata6]········[shotdataN]
2 block:00[shotdata1]1100[shotdata3]011101········[shotdataN]
3 block:110100[shotdata3]1100[shotdata5]11········[shotdataN]
                          :
M block:1100[shotdata2]0111111111111111111········[shotdataN]
```

FIG. 11

| Data Rate | Compression Rate |
|---|---|
| 50% | 70% |
| 25% | 45% |
| 6% | 25% |

SHOT DATA GENERATION METHOD AND MULTI CHARGED PARTICLE BEAM WRITING METHOD

CROSS-REFERENCE TO RELATED APPLICATION

This application is based upon and claims the benefit of priority from the prior Japanese Patent Application No. 2014-080480 filed on Apr. 9, 2014 in Japan, the entire contents of which are incorporated herein by reference.

BACKGROUND OF THE INVENTION

Field of the Invention

Embodiments of the present invention relate generally to a shot data generation method and a multi charged particle beam writing method, and more specifically, relate to a method for generating shot data in multi-beam writing, for example.

Description of Related Art

The lithography technique that advances miniaturization of semiconductor devices is extremely important as a unique process whereby patterns are formed in semiconductor manufacturing. In recent years, with high integration of LSI, the line width (critical dimension) required for semiconductor device circuits is decreasing year by year. The electron beam (EB) writing technique, which intrinsically has excellent resolution, is used for writing or "drawing" a pattern on a wafer and the like with electron beams.

As an example employing the electron beam writing technique, a writing apparatus using multiple beams (multi beams) can be cited. Compared with the case of writing a pattern by using a single electron beam, since it is possible to emit multiple beams at a time in multi-beam writing, the throughput can be greatly increased. For example, in a writing apparatus employing a multi-beam system, multiple beams are formed by letting an electron beam emitted from an electron gun assembly pass through a mask with a plurality of holes, blanking control is performed for each of the beams, and each unblocked beam is reduced by an optical system and deflected by a deflector so as to irradiate a desired position on a target object or "sample" (refer to, e.g., Japanese Published Unexamined Patent Application (JP-A) No. 2006-261342).

In multi-beam writing, since the number of beams is large, the amount of data for controlling an irradiation time period is enormous. For example, in the case where the number of beams is n×m and each irradiation time period data is k bits (for example, ten bits), the data amount of one irradiation is n×m×k bits. Then, it is necessary to transmit the data from the control unit to the irradiation unit within an irradiation time period. If the irradiation time period is, for example, around Tμs, the transmission speed of n×m×k/(T×10$^{-6}$) bps is needed. For example, the transmission speed of hundreds of Gbps is needed. For example, even when using a product with a transmission speed of 100 Gbps, several parallel lines are needed. If using a product with a transmission speed of 20 to 40 Gbps from a viewpoint of reliability of the current product, several tens or more of parallel lines are needed, which may cause a problem of difficulty in physical configuration. Therefore, it is necessary to reduce the data amount and to improve the writing method.

BRIEF SUMMARY OF THE INVENTION

According to one aspect of the present invention, a shot data generation method includes inputting writing data for writing a pattern on a target object with multi charged particle beams, and generating shot data for each beam of the multi charged particle beams by converting the writing data and using one of a first code indicating a first irradiation time period having been set beforehand, a second code indicating an irradiation time period being zero, and a third code indicating neither the first irradiation time period nor the irradiation time period being zero.

According to another aspect of the present invention, a multi charged particle beam writing method includes inputting writing data for writing a pattern on a target object with multi charged particle beams, generating shot data for each beam of the multi charged particle beams by converting the writing data and using one of a first code indicating a first irradiation time period having been set beforehand, a second code indicating an irradiation time period being zero, and a third code indicating neither the first irradiation time period nor the irradiation time period being zero, and writing the pattern on the target object with the multi charged particle beams each being based on an irradiation time period defined in each the shot data.

BRIEF DESCRIPTION OF THE DRAWINGS

FIG. 8 shows an example of 10-bit shot data according to the first embodiment;

FIG. 9 shows an example of a code list according to the first embodiment;

FIG. 10 shows an example of compressed data according to the first embodiment; and FIG. 11 shows an example of effect of data amount reduction according to the first embodiment.

DETAILED DESCRIPTION OF THE INVENTION

In the following embodiments, there will be described a configuration in which an electron beam is used as an example of a charged particle beam. The charged particle beam is not limited to the electron beam, and other charged particle beam such as an ion beam may also be used.

In the following embodiments, there will be described a shot data generation method and a writing method that can reduce the data amount in multi-beam writing.

First Embodiment

Figure 1:
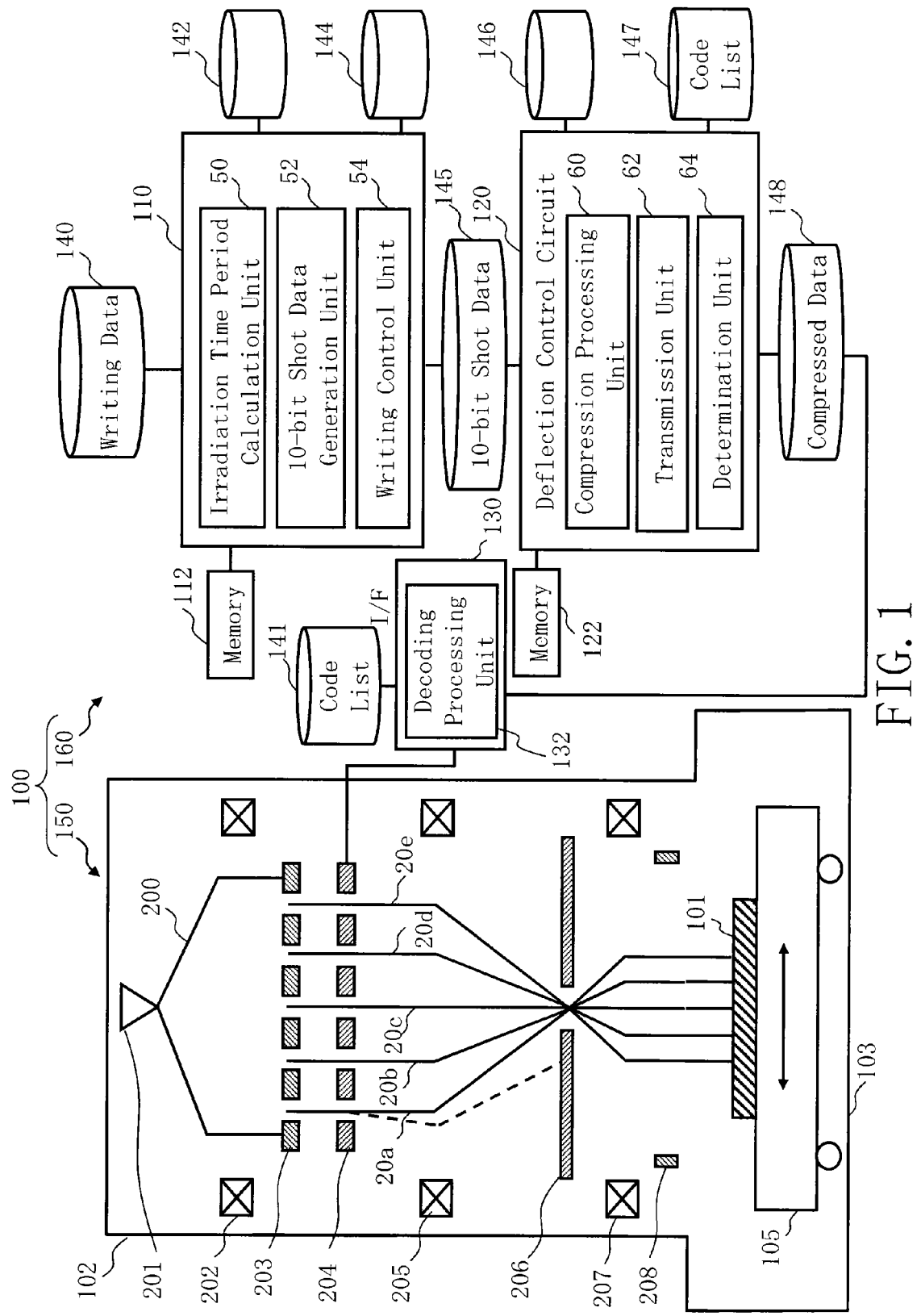
FIG. 1 is a schematic diagram showing a configuration of a writing apparatus according to a first embodiment.

FIG. 1 is a schematic diagram showing a configuration of a writing or "drawing" apparatus according to the first embodiment. In FIG. 1, a writing apparatus 100 includes a writing unit 150 and a control unit 160. The writing apparatus 100 is an example of a multi charged particle beam writing apparatus. The writing unit 150 includes an electron optical column 102 and a writing chamber 103. In the electron optical column 102, there are arranged an electron gun assembly 201, an illumination lens 202, an aperture member 203, a blanking plate 204, a reducing lens 205, a limiting aperture member 206, an objective lens 207, and a deflector 208. In the writing chamber 103, there is arranged an XY stage 105. On the XY stage 105, there is placed a target object or "sample" 101 such as a mask serving as a writing target substrate when performing writing. The target object 101 is, for example, an exposure mask used for manufacturing semiconductor devices, or is a semiconductor substrate (silicon wafer) on which semiconductor elements are formed. The target object 101 may be, for example, a mask blank on which resist has been applied and a pattern has not yet been formed.

Both the reducing lens 205 and the objective lens 207 are electromagnetic lenses, and a reduction optical system is configured by the reducing lens 205 and the objective lens 207.

The control unit 160 includes a control computer 110, a memory 112, a deflection control circuit 120, a memory 122, an interface circuit 130, storage devices 140, 141, 142, 144, 145, 146, 147, and 148 such as magnetic disk drives. The control computer 110, the memory 112, the deflection control circuit 120, the memory 122, the interface circuit 130, and the storage devices 140, 141, 142, 144, 145, 146, 147, and 148 are connected with each other through a bus (not shown).

The control computer 110, the memory 112, the deflection control circuit 120, the memory 122, and the storage devices 140, 142, 144, 146, 147, and 148 are arranged away from the writing unit 150. The interface circuit 130 and the storage device 141 are arranged near the writing unit 150. Respective logic circuits of a plurality of separate blanking systems (not shown) mounted in the blanking plate 204 are connected to the interface circuit 130 arranged at the writing unit 150 side. Then, shot data is transmitted between the interface circuits 130 of the writing unit 150 side and the control circuit of the control unit 160 side.

Writing data is input from the outside and stored in the storage device 140 (storage unit). A code list for identifying data is input from the outside and stored in the storage device 147 (storage unit). A code list for identifying data is input from the outside and stored in the storage device 141 (storage unit).

In the control computer 110, there are arranged an irradiation time period calculation unit 50, a 10-bit shot data generation unit 52, and a writing control unit 54. Each function, such as the irradiation time period calculation unit 50, the 10-bit shot data generation unit 52, and the writing control unit 54 may be configured by hardware such as an electric circuit, or by software such as a program causing a computer to implement these functions. Alternatively, they may be configured by a combination of hardware and software. Data which is input and output to/from the irradiation time period calculation unit 50, the 10-bit shot data generation unit 52, and the writing control unit 54, and data being operated are stored in the memory 112 each time.

In the deflection control circuit 120, there are arranged a compression processing unit 60, a transmission unit 62, and a determination unit 64. Each function, such as the compression processing unit 60, the transmission unit 62, and the determination unit 64 may be configured by hardware such as an electric circuit, or by software such as a program causing a computer to implement these functions. Alternatively, they may be configured by a combination of hardware and software. Data which is input and output to/from the compression processing unit 60, the transmission unit 62, and the determination unit 64, and data being operated are stored in the memory 122 each time.

In the interface circuit 130, a decoding processing unit 132 is arranged. A function, such as the decoding processing unit 132 may be configured by hardware such as an electric circuit, or by software such as a program causing a computer to implement these functions. Alternatively, it may be configured by a combination of hardware and software. Data which is input and output to/from the decoding processing unit 132, and data being operated are stored in a memory (not shown) each time.

FIG. 1 shows a configuration necessary for explaining the first embodiment. Other configuration elements generally necessary for the writing apparatus 100 may also be included.

Holes (openings) of m rows long (y direction) and n columns wide (x direction) (m≥2, m≥2) are formed, like a matrix, at a predetermined arrangement pitch in the aperture member 203. For example, holes of 512 (rows)×8 (columns) are formed. Each of the holes is a quadrangle of the same dimensions and shape. Alternatively, each of the holes can be a circle of the same circumference.

In the blanking plate 204, a passage hole is formed to be corresponding to the arrangement position of each hole of the aperture member 203, and a pair of electrodes (blanker: blanking deflector) is arranged for each passage hole. An amplifier for applying voltage is arranged at one of the two electrodes for each beam. A logic circuit is independently arranged at the amplifier for each beam. The other one of the two electrodes for each beam is grounded. An electron beam 20 passing through a corresponding passage hole is deflected by the voltage independently applied to the two electrodes being a pair. Blanking control is performed by this deflection.

Figure 2:
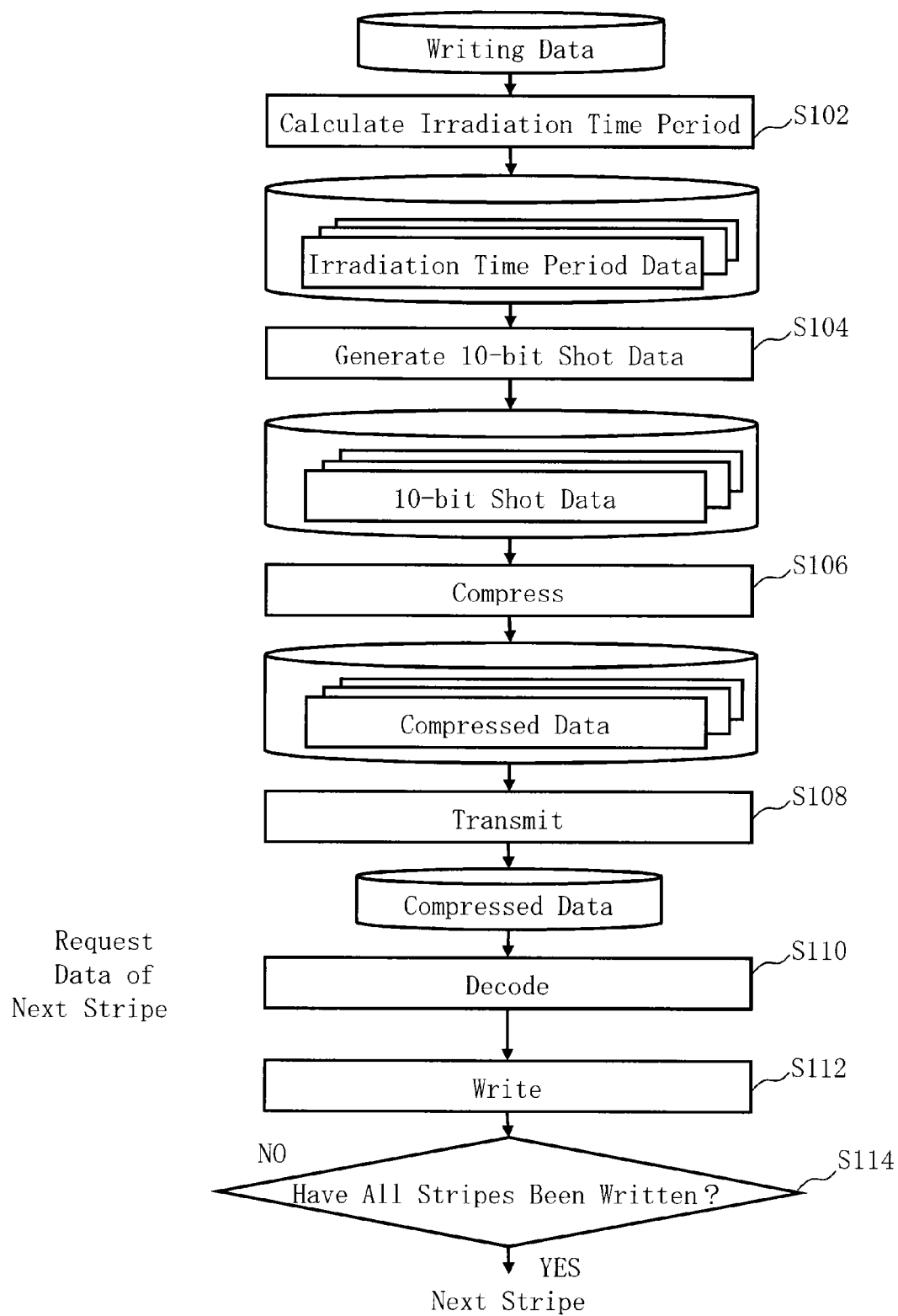
FIG. 2 is a flowchart showing main steps of a writing method according to the first embodiment.

FIG. 2 is a flowchart showing main steps of a writing method according to the first embodiment. In FIG. 2, the writing method of the first embodiment executes a series of steps: an irradiation time period calculation step (S102), a 10-bit shot data generation step (S104), a compression processing step (S106), a transmission step (S108), a decoding processing step (S110), a writing step (S112), and a determination step (S114).

In the irradiation time period calculation step (S102), the irradiation time period calculation unit 50 inputs (reads) writing data from the storage device 140, and performs data conversion of the writing data to calculate an irradiation time period at each irradiation position. The writing data defines, for example, an arrangement position, a figure type, a figure size, etc. of each figure pattern. In addition, a dose used as a reference is defined.

Figure 3A:
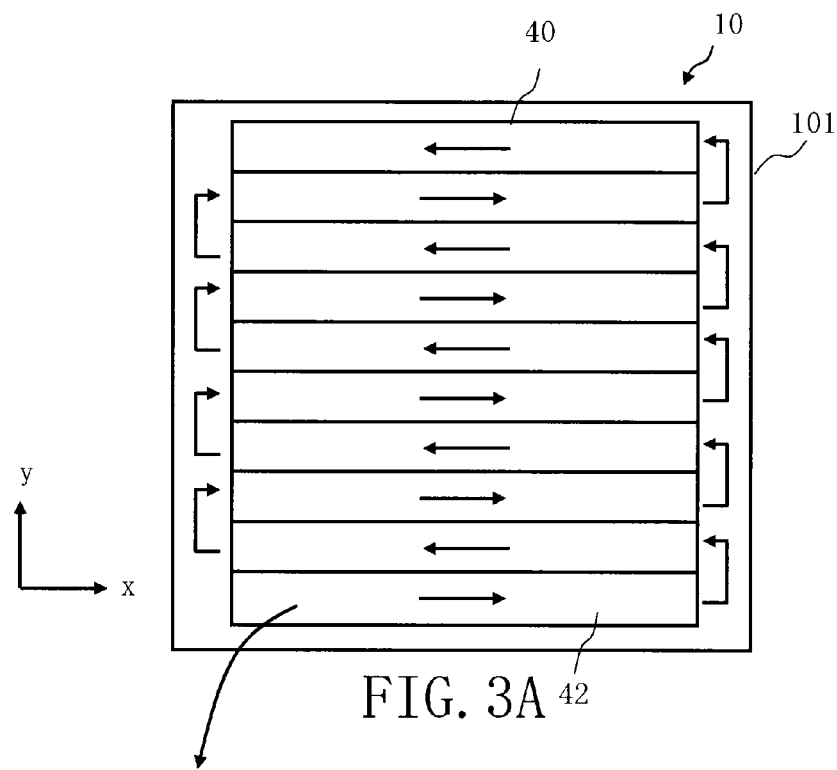
FIGS. 3A to 3C are conceptual diagrams explaining a writing operation according to the first embodiment.
Figures 3B, 3C:
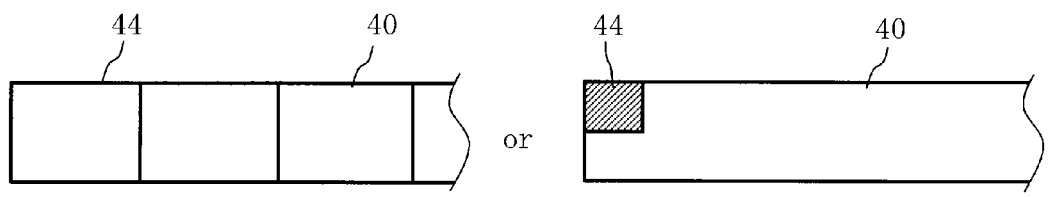

FIGS. 3A to 3C are conceptual diagrams explaining a writing operation according to the first embodiment. As shown in FIG. 3A, a writing region 10 of the target object 101 is virtually divided into a plurality of stripe regions 40 each in a strip shape and each having a predetermined width in the y direction, for example. Each of the stripe regions 40 serves as a unit of the writing region. First, the XY stage 105 is moved to make an adjustment such that an irradiation region 44 of a size that can be irradiated by once irradiation of the multi-beams 20 is located at the left end of the first stripe region 40 or at a position more left than the left end, and then writing is started. In the case of FIG. 3B, each of the widths in the x and y directions of the irradiation region 44 is the same as the width (y direction width) of the stripe region 40. In the case of FIG. 3C, each of the widths in the x and y directions of the irradiation region 44 is half (½) the width of the width (y direction width) of the stripe region 40.

When writing the first stripe region 40, the writing advances relatively in the x direction by moving the XY stage 105 in the −x direction, for example. The XY stage 105 is continuously moved at a predetermined speed, for example. After writing the first stripe region 40, the stage position is moved in the −y direction to make an adjustment such that the irradiation region is located at the right end of the second stripe region 40 or at a position more right than the right end, to be relatively located in the y direction. Then, similarly, writing advances in the −x direction by moving the XY stage 105 in the x direction, for example. That is, writing is performed while alternately changing the direction, such as performing writing in the x direction in the third stripe region 40, and in the −x direction in the fourth stripe region 40, and thus, the writing time can be reduced. However, the writing operation is not limited to the case of performing writing while alternately changing the direction, and it is also preferable to perform writing in the same direction when writing each stripe region 40. By one shot, a plurality of shot patterns whose number is equal to the number of the holes 22 are formed at a time in the irradiation region 44 by multi-beams which have been formed by passing through respective corresponding holes 22 of the aperture member 203.

In multi-beam writing, the writing region 10 (or the stripe region 40) is virtually divided into meshes by the size of 1/n (n being an integer of one or more) of the beam size of one of a plurality of beams forming multi-beams. Patterns are written by irradiating a beam to a mesh region in which a figure pattern exists, and by not irradiating a beam to a mesh region in which no figure pattern exists. When the edge of a figure pattern is located in a mesh, the position of the edge of the figure pattern is controlled by adjusting a dose. When a plurality of figure patterns are written, the dose may be modulated according to a figure pattern. Modulation rate data is separately stored in the storage device 140 and the like, and is read therefrom. Moreover, in order to correct dimensional variation due to the proximity effect, etc., it is necessary to adjust a dose. Correction calculation for the proximity effect should be performed by a conventional method. The dose is controlled by adjusting the irradiation time period of each beam of multi-beams. Therefore, the irradiation time period calculation unit 50 calculates an irradiation time period for each mesh position (beam irradiation position). By the method described above, a total irradiation time period for each mesh position (beam irradiation position) can be acquired. Total irradiation time period data for each mesh position (beam irradiation position) is stored in the storage device 142. It is preferable to calculate, for each stripe region, the total irradiation time period for each mesh position (beam irradiation position) in real time in accordance with the advance of writing processing. For example, it is preferable to perform calculation of a stripe region which is one or two stripes posterior to the stripe region being currently written.

Next, when performing multi-pass writing, the irradiation time period calculation unit 50 reads total irradiation time period data for each mesh position (beam irradiation position) from the storage device 142, and assigns the total irradiation time period to each pass of multi-pass writing.

Figure 4:
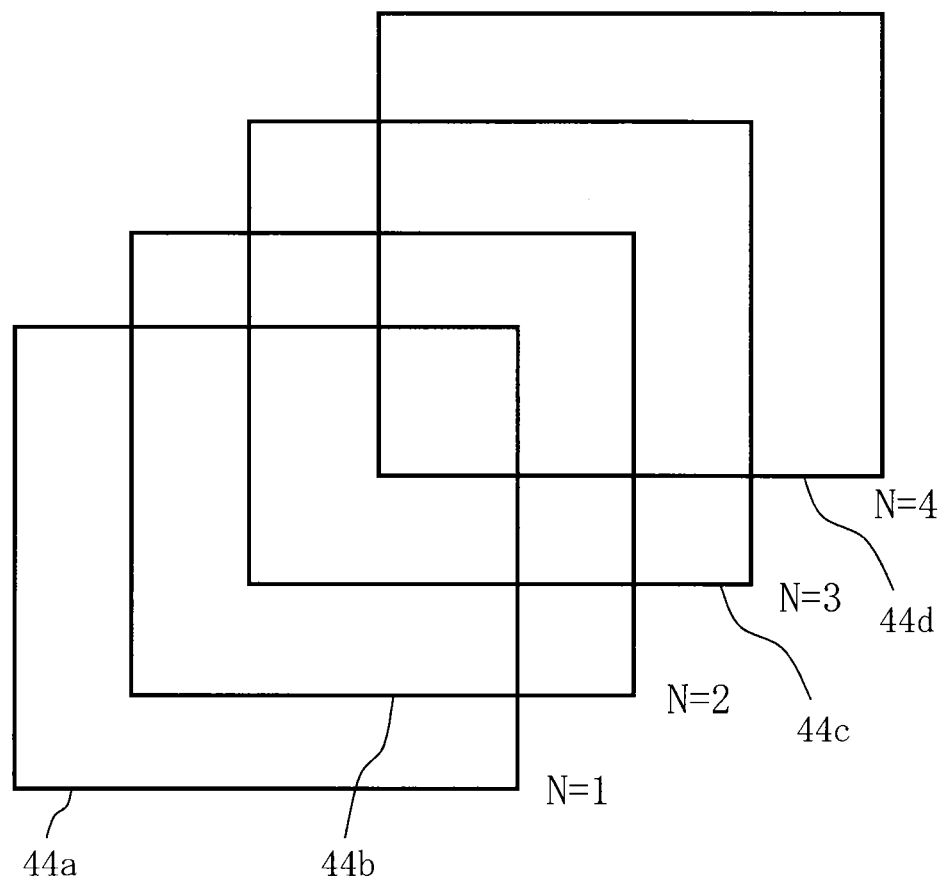
FIG. 4 illustrates a multi-pass writing method according to the first embodiment.

FIG. 4 illustrates a multi-pass writing method according to the first embodiment. In the multi-pass writing, for example, when writing with four passes (multiplicity N=4), it is preferable to perform writing while shifting the position as shown with respect to irradiation regions 44a to 44d. It is also acceptable to perform multi-pass writing without shifting the position.

According to the first embodiment, as described later, a total irradiation time period T is assigned to each pass of multi-pass writing so that it may become a pre-set irradiation time period X (first irradiation time period) or so that the irradiation time period may become zero as much as possible in order to reduce the amount of shot data. The number of passes actually used for writing should be variable. However, in order to perform multi-pass writing, the minimum number S of times of irradiation should be pre-set. Moreover, an upper limit number P of passes (that is, maximum number of times of irradiation) is set in advance.

Figure 5:
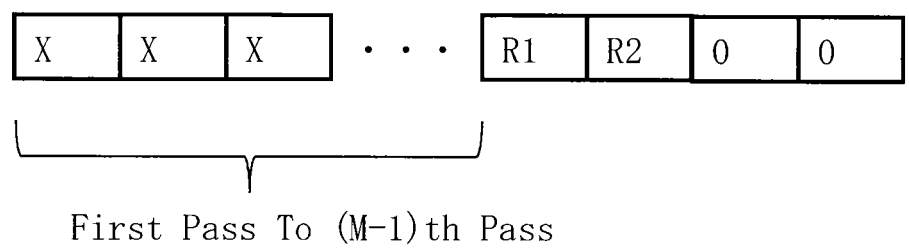
FIG. 5 illustrates an example of each irradiation time period of multi-pass writing according to the first embodiment.

FIG. 5 illustrates an example of each irradiation time period of multi-pass writing according to the first embodiment.

Figure 6:
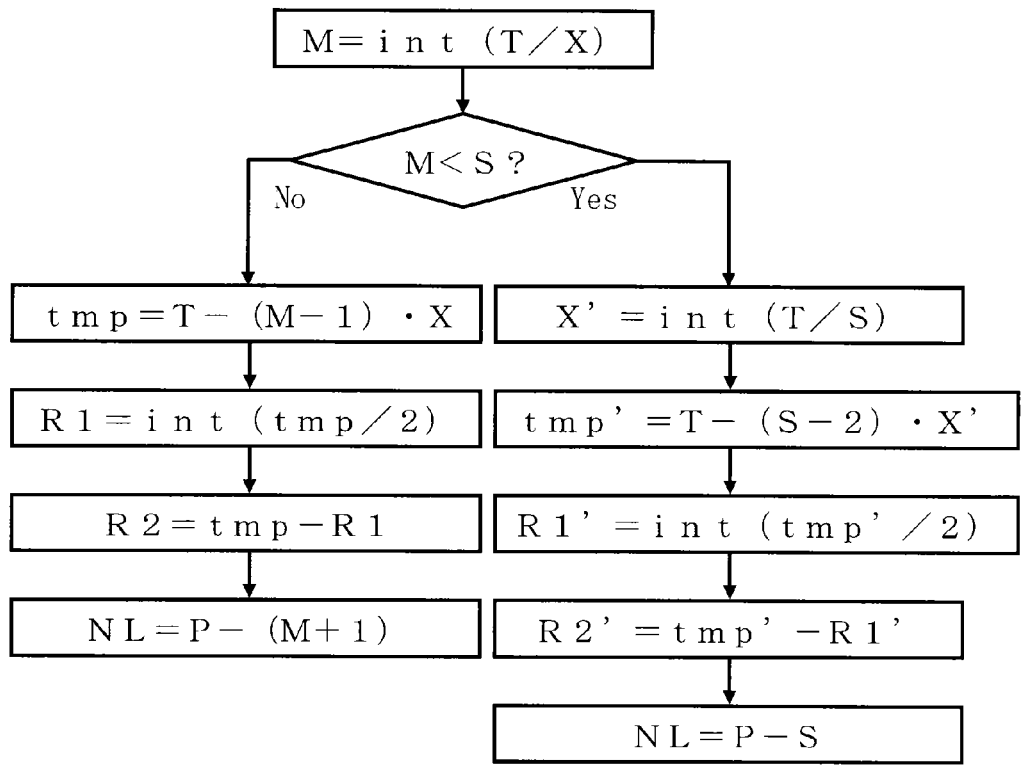
FIG. 6 illustrates an example of a calculation processing flow according to the first embodiment.

FIG. 6 illustrates an example of a calculation processing flow according to the first embodiment.

M being the number of times of irradiation based on the irradiation time period X, (that is, M being a first irradiation times), in the pre-set upper limit number P of passes (the number of passes) having been set for the multi-pass writing is calculated by dividing a total irradiation time period T at a mesh position concerned, which may be different for each mesh position, by a pre-set irradiation time period X (first irradiation time period), for each mesh position in a plurality of mesh positions (irradiation positions) obtained by virtually dividing the writing region 10 (or the stripe region 40) of the target object 101 into meshes. In other words, M being the number of times of irradiation which can be irradiated based on the irradiation time period X is calculated for each mesh position (beam irradiation position). M, the number of times of irradiation, can be defined by the following equation (1).

$$M=\text{int}(T/X) \quad (1)$$

By the equation (1), the integer value in the solution of T/X is obtained as M. Here, the calculation methods are different depending upon whether M≥S or M<S.

When M≥S, each of (M−1) passes, that is passes of (M−1) times (for example, from the first pass to the (M−1)th pass), in the pass number upper limit P can be defined by the irradiation time period X. Next, with respect to two passes, that is passes of two times (for example, from the Mth pass to the (M+1)th pass), irradiation time periods R1 and R2 are to be calculated. Then, first, intermediate data tmp is calculated. The intermediate data tmp can be defined by the following equation (2).

$$\text{tmp}=T-(M-1)\cdot X \quad (2)$$

The irradiation time period R1 can be defined by the following equation (3).

$$R1=\text{int}(\text{tmp}/2) \quad (3)$$

By the equation (3), the integer value in the solution of tmp/2 is obtained as R1. Then, the irradiation time period R2 can be defined by the following equation (4).

$$R2=\text{tmp}-R1 \quad (4)$$

When (M+1)≤P, NL being the number of passes whose irradiation time period is zero can be defined by the following equation (5). In addition, it is preferable to set P, being the upper limit of passes, to be (M+1)≤P.

$$NL=P-(M+1) \quad (5)$$

According to what is described above, for example, the irradiation time period with respect to from the first pass to the (M−1)th pass can be defined by the irradiation time period X. In other words, with respect to the irradiation time period for each pass in the pass number upper limit P (the number of passes), the irradiation time period for each of (M−1) irradiation times is calculated as an irradiation time period X (first irradiation time period), where subtracting 1 from M irradiation times (first irradiation times) is (M−1) irradiation times (second irradiation times). Then, with respect to the irradiation time period for each pass in the pass number upper limit P (the number of passes), the irradiation time period for each of NL irradiation times (third irradiation times) is calculated as zero, where subtracting (M+1) (first value) from the pass number upper limit P is NL and (M+1) is obtained by adding 1 to M irradiation times. Further, with respect to the irradiation time period for each pass in the pass number upper limit P (the number of passes), the irradiation time period for each of irradiation times other than the (M−1) irradiation times (second irradiation times) and the NL irradiation times (third irradiation times) is calculated using intermediate data tmp (fourth value) which is obtained by subtracting a value ((M−1)·X) (third value) from the total irradiation time period T, where the value ((M−1)·X) is calculated by multiplying a value (M−1) (second value), which is obtained by subtracting 1 from M irradiation times (first irradiation times), by the irradiation time period X (first irradiation time period). Then, the irradiation time period of the Mth pass can be defined by the irradiation time period R1. The irradiation time period of the (M+1)th pass can be defined by the irradiation time period R2. As to be described later, if the irradiation time period X and the irradiation time period 0 (zero) are encoded using small number of bits, the irradiation time period for the passes other than the Mth pass and the (M−1)th pass in the upper limit of passes can be encoded. Therefore, the amount of data can be reduced.

Next, when M<S, it is necessary to change the irradiation time period X. Then, first, a new irradiation time period X' (first irradiation time period) is calculated. The new irradiation time period X' can be defined by the following equation (6).

$$X' = \text{int}(T/S) \quad (6)$$

Figure 7:
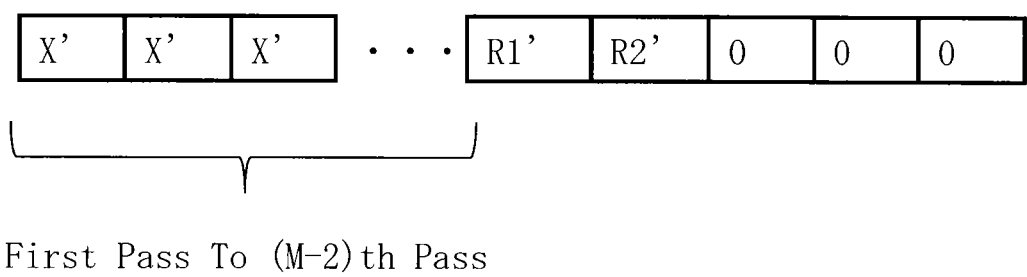
FIG. 7 illustrates another example of an irradiation time period in multi-pass writing according to the first embodiment.

FIG. 7 illustrates another example of an irradiation time period in multi-pass writing according to the first embodiment.

Using the equation (6), the integer value in the solution of T/S is obtained as a new irradiation time period X'. Each of (S−2) passes, that is passes of (S−2) times (for example, from the first pass to the (S−2) th pass), in the pass number upper limit P can be defined by the irradiation time period X'. Next, with respect to two passes, that is passes of two times (for example, from the (S−1)th pass to the Sth pass), irradiation time periods R1' and R2' are to be calculated. Then, first, intermediate data tmp' is calculated. The intermediate data tmp' can be defined by the following equation (7).

$$\text{tmp}' = T - (S-2) \cdot X' \quad (7)$$

The irradiation time period R1' can be defined by the following equation (8).

$$R1' = \text{int}(\text{tmp}'/2) \quad (8)$$

Using the equation (8), the integer value in the solution of tmp'/2 is obtained as R1'. Then, the irradiation time period R2' can be defined by the following equation (9).

$$R2' = \text{tmp}' - R1' \quad (9)$$

NL being the number of passes whose irradiation time period is zero can be defined by the following equation (10).

$$NL = P - S \quad (10)$$

According to what is described above, for example, the irradiation time period with respect to from the first pass to the (S−2)th pass can be defined by the irradiation time period X'. In other words, with respect to the irradiation time period for each pass in the pass number upper limit P (the number of passes), the irradiation time period for each of (S−2) irradiation times (another example of the second irradiation times) is calculated as an irradiation time period X' (another example of the first irradiation time period), where subtracting 2 from S being the minimum number of times of irradiation (another example of the first irradiation times) is (S−2) irradiation times. Then, with respect to the irradiation time period for each pass in the pass number upper limit P (the number of passes), the irradiation time period for each of NL irradiation times (another example of the third irradiation times) is calculated as zero, where subtracting the minimum irradiation times S (another example of the first irradiation times) from the pass number upper limit P is NL irradiation times. Further, with respect to the irradiation time period for each pass in the pass number upper limit P (the number of passes), the irradiation time period for each of irradiation times other than the (S−2) irradiation times (another example of the second irradiation times) and NL irradiation times (another example of the third irradiation times) is calculated using intermediate data tmp' (another example of the fourth value) which is obtained by subtracting a value ((S−2)·X') (another example of the third value) from the total irradiation time period T, where the value ((S−2)·X') is calculated by multiplying a value (S−2) (another example of the second value), which is obtained by subtracting 2 from the minimum irradiation times S (another example of the first irradiation times), by the irradiation time period X' (another example of the first irradiation time period). Then, the irradiation time period of the (S−1)th pass can be defined by the irradiation time period R1'. The irradiation time period of the Sth pass can be defined by the irradiation time period R2'. As to be described later, if the irradiation time period X' and the irradiation time period 0 (zero) are encoded using small number of bits, the irradiation time period for the passes other than the (S−1)th pass and the Sth pass in the pass number upper limit P can be encoded. Moreover, when M<S, the NL irradiation times can be increased. Therefore, the amount of data can be reduced.

Conventionally, when performing multi-pass writing, the irradiation time period for each pass is calculated by int (T/P), for each mesh position (beam irradiation position). Therefore, when the total irradiation time periods T are different depending upon each of mesh positions (beam irradiation positions), it is difficult to set to one specific irradiation time period X (or irradiation time period X') which is used in the first embodiment. Therefore, encoding of the irradiation time period has been conventionally difficult.

On the other hand, according to the first embodiment, data compression efficiency can be increased as to be described later by controlling the dose (irradiation time period) for each pass so that the number of encodable irradiation time periods may increase as described above. Irradiation time period data for each mesh position (beam irradiation position) of each pass is stored in the storage device 144.

In the 10-bit shot data generation step (S104), for each multi-beam irradiation (each block), the 10-bit shot data generation unit 52 generates shot data defining the irradiation time period of each beam of the multi beams by using, for example, ten bits. The generated 10-bit shot data is stored in the storage device 145. Specifying a mesh position (beam irradiation position) irradiated by each beam of the multi-beams of each shot, the irradiation time period (irradiation time period for each pass when performing multi-pass writing) at the mesh position (beam irradiation position) is assigned as the irradiation time period for each beam.

FIG. 8 shows an example of the 10-bit shot data according to the first embodiment. In FIG. 8, for each multi-beam irradiation (each block), the irradiation time period of each beam of the multi-beams is defined as shot data. When multi-beam is composed of N beams, shot data 1 (shotdata1) to shot data N (shotdataN), each being 10-bits, are defined for each block. Therefore, when writing the stripe region 40 by M times irradiation of multi-beams, the number of blocks is M, and then, shot data 1 (shotdata1) to shot data N (shotdataN), each being 10-bits, are needed for each of the first block to the Mth block. In performing multi-pass writing, M being the number of blocks becomes a further enormous value. Therefore, the data amount of shot data for each stripe region becomes huge, for example. Then, according to the first embodiment, an irradiation time period is divided into three time periods to be encoded, that is the irradiation time period X (or irradiation time period X'), the irradiation time period zero, and the other irradiation time period, thereby reducing the amount of data.

In the compression processing step (S106), the compression processing unit 60 reads shot data from the storage device 145 and a code list from the storage device 147, and compresses the data using one of the code "11" (first code) indicating a pre-set irradiation time period X (or irradiation time period X') (first irradiation time period), the code "01" (second code) indicating the irradiation time period being zero, and the code "00" (third code) indicating neither the irradiation time period X (or irradiation time period X') nor the irradiation time period being zero, in order to generate shot data (compressed data) for each beam of multi-beams. Each code (each of first to third codes) is defined by a two-bit code. When the code "00" is used, irradiation time period data whose number of bits is larger than two bits, for example, ten bits, is defined with the code "00". The generated compressed data is temporarily stored in the storage device 148.

FIG. 9 shows an example of a code list according to the first embodiment. As shown in FIG. 9, the two-bit code "11" indicates the pre-set irradiation time period X (or irradiation time period X'). The two-bit code "01" indicates that the irradiation time period is zero. The two-bit code "00" indicates neither the irradiation time period X (or irradiation time period X') nor the irradiation time period being zero.

FIG. 10 shows an example of compressed data according to the first embodiment. In FIG. 10, the shot data 1 of the block 1 shown in FIG. 8 indicates that the irradiation time period is the irradiation time period X. The shot data 2 of the block 1 indicates that the irradiation time period is zero. The shot data 3 of the block 1 indicates that the irradiation time period is the irradiation time period X. The shot data 4 of the block 1 indicates the case neither the irradiation time period X nor the irradiation time period being zero. The shot data 5 of the block 1 indicates that the irradiation time period is the irradiation time period X. The shot data 6 of the block 1 indicates that the case neither the irradiation time period X nor the irradiation time period being zero. Therefore, the shot data of the block 1 can be compressed as "11011100 {shot data 4}1100{shot data 6} . . . ".

Moreover, the shot data 1 of the block 2 shown in FIG. 8 indicates the case neither the irradiation time period X nor the irradiation time period being zero. The shot data 2 of the block 2 indicates that the irradiation time period is the irradiation time period X. The shot data 3 of the block 2 indicates the case neither the irradiation time period X nor the irradiation time period being zero. The shot data 4 of the block 2 indicates that the irradiation time period is zero. The shot data 5 of the block 2 indicates that the irradiation time period is the irradiation time period X. The shot data 6 of the block 2 indicates that the irradiation time period is zero. Therefore, the shot data of the block 2 can be compressed as "00 { shot data 1}1100 {shot data 3}1011101 . . . ".

FIG. 11 shows an example of the effect of data amount reduction according to the first embodiment. In FIG. 11, the data rate is defined to be data rate=(the number of data of code "00")/(the number of data of code "11"+the number of data of code "01"). With respect to the compression rate, encoding as described in the first embodiment is not performed, but there is shown a ratio to the case where ten-bit data are all used as shown in FIG. 8. According to the first embodiment, as shown in FIG. 11, when the data rate is 50%, the compression rate can be 70%, for example. When the data rate is 25%, the compression rate can be 45%, for example. When the data rate is 6%, the compression rate can be 25%, for example.

As described above, according to the first embodiment, it is possible to reduce the data amount of shot data in multi-beam writing.

In the transmission step (S108), the transmission unit 62 transmits the compressed shot data to the interface circuit 130. Since the amount of shot data is small due to being compressed, the transmission time can shortened. The shot data may be transmitted for each block or for each stripe region.

In the decoding processing step (S110), when the interface circuit 130 arranged close to the writing unit 150 receives the transmitted shot data (compressed data), the decoding processing unit 132 reads a code list from the storage device 141, and decodes the compressed data. By this processing, the code "11" (first code) is decoded to, for example, 10-bit data indicating the pre-set irradiation time period X (or irradiation time period X') (first irradiation time period). Similarly, the code "01" (second code) is decoded to, for example, 10-bit data indicating that the irradiation time period is zero. Since the code "00" (third code) is originally used with, for example, 10-bit data indicating an irradiation time period, it becomes the 10-bit data. In other words, the compressed data shown in FIG. 10 returns to the shot data before the compression shown in FIG. 8.

In the writing step (S112), under the control of the writing control unit 54, the writing unit 150 writes a pattern on the target object 101 by using multi beams each being based on an irradiation time period defined in each shot data, by a control circuit (not shown). Specifically, first, for each block, decoded shot data for each beam (for example, 10-bit data) is output to each logic circuit 41 on the blanking plate 204. In each logic circuit 41, there are arranged a shift register, a register, and a counter, for example. In accordance with the order of the shift register, shot data in a block concerned is transmitted in order, for each block. While being counted by the counter, each beam still in the ON state, without being changed to the OFF state by blanking, is passed at the side of the target object 101. Thereby, the target object 101 is irradiated with the beam of a desired irradiation time period.

The electron beam 200 emitted from the electron gun assembly 201 (emission unit) almost perpendicularly (e.g., vertically) illuminates the whole of the aperture member 203 by the illumination lens 202. A plurality of holes (openings) each being a quadrangle are formed in the aperture member 203. The region including all the plurality of holes is irradiated with the electron beam 200. For example, a plurality of quadrangular electron beams (multi-beams) 20a to 20e are formed by letting portions of the electron beam 200 irradiating the positions of a plurality of holes pass through a corresponding hole of the plurality of holes of the aperture member 203 respectively. The multi-beams 20a to 20e respectively pass through corresponding blankers (first deflectors: separate blanking systems) of the blanking plate 204. Each blanker deflects (performs blanking deflection) the separately passing electron beam 20.

The multi-beams 20a, 20b, . . . , 20e having passed through the blanking plate 204 are reduced by the reducing lens 205, and travel toward the hole at the center of the limiting aperture member 206. At this time, the electron beam 20 deflected by the blanker of the blanking plate 204 deviates from the hole at the center of the limiting aperture member 206 (blanking aperture member) and is blocked by the limiting aperture member 206. On the other hand, the electron beam 20 not deflected by the blanker of the blanking plate 204 passes through the hole at the center of the limiting aperture member 206 as shown in FIG. 1. Thus, the limiting aperture member 206 blocks each beam which was deflected to be in the OFF state by the separate blanking systems. One beam shot is formed by a beam which has been formed during from a beam ON state to a beam OFF state and has passed through the limiting aperture member 206. The multi beams 20 having passed through the limiting aperture member 206 are focused by the objective lens 207 in order to be a pattern image of a desired reduction ratio, and respective beams (the entire multi beams 20) having passed through the limiting aperture member 206 are collectively deflected in the same direction by the deflector 208 so as to irradiate respective irradiation positions on the target object 101. For example, while the XY stage 105 is continuously moving, controlling is performed by the deflector 208 so that irradiation positions of beams may follow the movement of the XY stage 105. Ideally, multi beams 20 to irradiate at a time are aligned at pitches obtained by multiplying the arrangement pitch of a plurality of holes of the aperture member 203 by a desired reduction rate described above. The writing apparatus 100 performs a writing operation by the raster scan method which continuously irradiates shot beams in order, and when writing a desired pattern, a required beam is controlled by blanking control to be ON according to the pattern.

Regarding the writing operation in a stripe, a stripe region is divided in the y direction by twice the width of the irradiation region of the entire multi-beam, for example. When performing writing in a stripe by using, for example, 4×4 multi beams in the x and y directions, one irradiation region of the entire multi beams is exposed (written) by shots of four times performed while shifting the irradiation position by one mesh by one mesh in the x direction or the y direction. By sequentially shifting the irradiation position, the entire stripes are exposed (written). Alternatively, in the case where there is a distance between beams and a stripe region is divided, for example, in the y direction by a width somewhat greater than or equal to the irradiation region of the entire multi beams, one irradiation region of the entire multi beams is exposed (written) by shots of sixteen times performed while shifting the irradiation position by one mesh by one mesh in the x direction or the y direction. By sequentially shifting the irradiation position, the entire stripes are exposed (written).

In the determination step (S114), the determination unit 64 determines whether writing of all the stripe regions has been completed. If writing of all the stripe regions has been completed, it ends the processing. If writing of all the stripe regions has not been completed yet, it returns to the transmission step (S108), and repeats the steps from the transmission step (S108) to the writing step (S112) until writing of all the stripe regions has been completed.

As described above, according to the first embodiment, the amount of shot data at the time of transmission can be reduced in multi-beam writing.

The embodiment has been explained referring to concrete examples described above. However, the present invention is not limited to these specific examples. Although 10-bit shot data is used in the examples described above, it is not limited thereto. Since 10-bits is just exemplified, other number of bits may also be used.

While the apparatus configuration, control method, and the like not directly necessary for explaining the present invention are not described, some or all of them can be selectively used case-by-case basis. For example, although description of the configuration of the control unit for controlling the writing apparatus 100 is omitted, it should be understood that some or all of the configuration of the control unit can be selected and used appropriately when necessary.

In addition, any other multi charged particle beam writing apparatus and method that include elements of the present invention and that can be appropriately modified by those skilled in the art are included within the scope of the present invention.

Additional advantages and modification will readily occur to those skilled in the art. Therefore, the invention in its broader aspects is not limited to the specific details and representative embodiments shown and described herein.

Accordingly, various modifications may be made without departing from the spirit or scope of the general inventive concept as defined by the appended claims and their equivalents.

What is claimed is:

1. A shot data generation and writing method comprising:
    inputting, with a circuit or a computer, writing data for writing a pattern on a target object with multiple charged particle beams;
    calculating, with the circuit or the computer, first irradiation times which perform irradiation based on a first irradiation time period, in a number of passes having been set in multi-pass writing;
    calculating, with the circuit or the computer, second irradiation times which perform irradiation based on a second irradiation time period being zero, in the number of passes having been set in the multi-pass writing;
    calculating, with the circuit or the computer, a third irradiation time period being neither the first irradiation time period nor zero, for one of two passes in the number of passes having been set in the multi-pass writing;
    calculating, with the circuit or the computer, a fourth irradiation time period being neither the first irradiation time period nor zero, for an another pass of the two passes in the number of passes having been set in the multi-pass writing; and
    generating, with the circuit or the computer, shot data for each beam of the multiple charged particle beams by converting the writing data and using a first code indicating the first irradiation time period for irradiation time period data of passes of the first irradiation times, a second code indicating an irradiation time period being zero for irradiation time period data of passes of the second irradiation times, and a third code indicating neither the first irradiation time period nor the irradiation time period being zero for each irradiation time period data of the two passes; and writing the pattern on the target object with the multiple charged particle beams each based on the irradiation time periods indicated in the shot data.

2. The method according to claim 1, wherein each of the first code, the second code, and the third code is defined by a two-bit code.

3. The method according to claim 1, wherein when the third code is used as the shot data for a beam concerned of the multiple charged particle beams, irradiation time period data whose number of bits is larger than two bits is defined with the third code.

4. The method according to claim 1 further comprising:
calculating third irradiation times which perform irradiation based on the first irradiation time period, in a number of passes having been set in the multi-pass writing, by dividing a total irradiation time period at an irradiation position concerned in a plurality of irradiation positions, where the total irradiation time period is sometimes different for each of the plurality of irradiation positions, by the first irradiation time period which has been set beforehand, where the calculating is performed for each of the plurality of irradiation positions in meshes obtained by virtually dividing a writing region of the target object into the meshes; and
obtaining an irradiation time period for each of the first irradiation times which is calculated by subtracting 1 from the third irradiation times, as the first irradiation time period concerning irradiation time periods for respective passes in the number of passes having been set in the multi-pass writing, obtaining an irradiation time period for each of the second irradiation times, as zero, where the second irradiation times is calculated by subtracting a first value obtained by adding 1 to the third irradiation times from the number of passes having been set in the multi-pass writing, concerning the irradiation time periods for the respective passes in the number of passes having been set in the multi-pass writing, and obtaining an irradiation time period for each of irradiation times other than the first irradiation times and the second irradiation times by calculating a second value by subtracting 1 from the third irradiation times, a third value by multiplying the second value by the first irradiation time period, and a fourth value by subtracting the third value from the total irradiation time period, and using the fourth value to obtain the irradiation time period for each of the irradiation times other than the second irradiation times and the third irradiation times concerning the irradiation time periods for the respective passes in the number of passes having been set in the multi-pass writing.

5. The method according to claim 4, wherein as the third irradiation times, an integer value in a solution of dividing the total irradiation time period by the first irradiation time period is used.

6. The method according to claim 1, further comprising:
obtaining an integer value M in a solution of T/X by dividing a total irradiation time period T by an irradiation time period X having been set beforehand, for each irradiation position in a plurality of irradiation positions obtained by virtually dividing a writing region of the target object into meshes.

7. The method according to claim 6, further comprising:
calculating, for the each irradiation position, an irradiation time period R1 of an Mth pass and an irradiation time period R2 of an (M+1)th pass when a relation between the integer value M and a minimum number S of times of irradiation is M≥S.

8. The method according to claim 7, further comprising:
calculating intermediate data tmp defined by an equation (2), for each irradiation position, where the equation (2) is tmp=T−(M−1)−X.

9. The method according to claim 8, wherein the irradiation time period R1 is an integer value in a solution of tmp/2.

10. The method according to claim 9, wherein the irradiation time period R2 is a solution of tmp−R1.

11. A multiple charged particle beams writing method comprising:
inputting, with a circuit or a computer, writing data for writing a pattern on a target object with multiple charged particle beams;
calculating, with the circuit or the computer, first irradiation times which perform irradiation based on a first irradiation time period, in a number of passes having been set in multi-pass writing;
calculating, with the circuit or the computer, second irradiation times which perform irradiation based on a second irradiation time period being zero, in the number of passes having been set in the multi-pass writing;
calculating, with the circuit or the computer, a third irradiation time period being neither the first irradiation time period nor zero, for one of two passes in the number of passes having been set in the multi-pass writing;
calculating, with the circuit or the computer, a fourth irradiation time period being neither the first irradiation time period nor zero,
generating, with the circuit or the computer, shot data for each beam of the multiple charged particle beams by converting the writing data and using a first code indicating the first irradiation time period for irradiation time period data of passes of the first irradiation times, a second code indicating an irradiation time period being zero for irradiation time period data of passes of the second irradiation times, and a third code indicating neither the first irradiation time period nor the irradiation time period being zero for each irradiation time period data of the two passes; and
writing the pattern on the target object with the multiple charged particle beams each being based on the irradiation time periods indicated in the shot data.

* * * * *